United States Patent [19]
Richardson

[11] Patent Number: 6,081,912
[45] Date of Patent: Jun. 27, 2000

[54] METHOD FOR MODULATING DATA FOR STORAGE IN PAGE-WISE MEMORY

[75] Inventor: Thomas J. Richardson, South Orange, N.J.

[73] Assignee: Lucent Technologies Inc., Murray Hill, N.J.

[21] Appl. No.: 08/777,153

[22] Filed: Dec. 26, 1996

[51] Int. Cl.[7] .................................................. G11C 29/00
[52] U.S. Cl. ......................................... 714/722; 714/718
[58] Field of Search ...................................... 714/722, 718

[56] References Cited

U.S. PATENT DOCUMENTS

| | | | |
|---|---|---|---|
| 4,149,269 | 4/1979 | Abe et al. | 365/215 |
| 5,784,291 | 7/1998 | Chen et al. | 364/491 |

FOREIGN PATENT DOCUMENTS

| | | | |
|---|---|---|---|
| 0 201 274 | 12/1986 | European Pat. Off. | G03H 1/26 |

*Primary Examiner*—Phung M. Chung
*Attorney, Agent, or Firm*—John M. Harman

[57] ABSTRACT

Embodiments of the invention include a method and apparatus for modulating data retrieved from page-wise memory systems such as holographic memory systems. The inventive method uses the detection of one or more test signals included within stored data image pages to estimate the behavior of the retrieved data image pages and to normalize the retrieved information accordingly. The method includes allocating a portion of the data image pages of interest for one or more determinable test signals and incorporating the test signal information into the data image pages prior to storage of the data image pages within the storage medium. Upon retrieval of the data image pages from the storage medium, the test signals are detected and used to form the basis of estimated data member behavior across individual data image pages and, alternatively, from one data image page to another. Based on the estimated behavior, appropriate normalization is performed on the data image pages. Advantageously, embodiments of the invention provide enhanced compensation for reproduction inconsistencies existing throughout the data image pages, e.g., inconsistencies inherently caused by holographic storage systems. Alternatively, the behavior estimation is supplemented with generation profiles indicating the behavior of data within the data image pages. The generated profile is used, e.g., to assist in normalizing the data image pages. Also, interpolation techniques alternatively assist the behavior estimation and/or the normalization of the data image pages.

20 Claims, 1 Drawing Sheet

METHOD FOR MODULATING DATA FOR STORAGE IN PAGE-WISE MEMORY

BACKGROUND OF THE INVENTION

1. Field of the Invention

The invention relates to modulating data for storage within and retrieval from data storage devices such as holographic memory devices and other data storage media.

2. Description of the Related Art

Improving the accuracy of the retrieval of data stored within, e.g., holographic and other page-wise memory devices continues to remain key to successful and widespread implementation of these memory systems. Page-wise memory systems are characterized by the storage and/or readout of an entire page of information in a single operation. That is, unlike conventional memory devices, which store data members in strings or bits, page-wise memories store and retrieve data members in pages in the form of multi-dimensional arrayed patterns of data representations.

A holographic memory or data storage system typically involves three-dimensional storage of holographic representations (i.e., holograms) of data images as a pattern of varying refractive index and/or absorption imprinted in a storage medium such as a crystal of lithium niobate. Holographic memory systems are characterized by their high density storage potential and the potential speed with which the stored data is randomly accessed and transferred.

When stored data is to be recalled from page-wise memory systems including holographic memory systems, detector arrays are used for reading the information emerging from the memory pages. Typically, the recalled holographic information is projected onto an imaging unit such as a charged coupled device (CCD) or a CMOS detector array such as an active pixel sensor (APS), which are sensitive to the emerging optical information. A decoding unit coupled to the imaging unit then determines the corresponding values of the recovered data, which hopefully corresponds to the initially encoded data that was holographically stored.

However, reproduction of data images stored in holographic storage devices are less than ideal due to effects often inherent in holographic memory systems. For example, the number of data members imprinted in the storage medium typically is inversely proportional to the diffraction efficiency and thus the reliability of the holograms stored therein to be reproduced upon read out. Other factors often affecting the quality of the stored data include time-dependent fluctuations in light intensity throughout the storage medium, physical and optical disturbance of the mechanical relationship between memory system components, thermal expansion and other temperature-induced variations throughout the system, and other noise introduced into the system.

Because of the often poor quality in retrieving or reproducing such data, the value of an individual data member often is represented as the comparison of multiple data members or by some similar other encoding technique. For example, it is possible to employ a differential encoding scheme in which a particular data value sought to be retrieved results from the comparison of one retrieved data member relative to another. Alternatively, it is possible to use a reference encoding scheme, in which the value of a data member is compared to one or more known reference data member values. See, for example, U.S. Pat. No. 5,450,218 and U.S. Pat. No. 5,838,469 entitled "Apparatus And Method For Processing Data Stored In Page-Wise Memory", filed on even date herewith.

However, such encoding schemes require the use of more than one data member to represent the data value of a single data member. It is this data "overhead" that reduces data storage efficiency. But, see, for example, co-pending application "Comparator-Based Thresholding Method For Determining Data Values", Ser. No. 08/777,154, Atty. Docket: Campbell 4-12-5, filed on even date herewith, in which data storage overhead is reduced by using actual data members to assist in data value determination.

Still, the inherent effects within such memory systems cause inconsistent reproduction within data pages and from data page to data page. Thus, there exists a need for estimating or otherwise compensating for inconsistent reproduction of data images.

SUMMARY OF THE INVENTION

The invention is embodied in a method for modulating data retrieved from page-wise memory systems such as holographic memory systems. The inventive method uses the detection of one or more test signals included within stored data image pages to estimate the behavior of the data image pages. Based on its estimated behavior, the retrieved information is normalized accordingly. The method includes allocating a portion of the data image pages of interest for one or more determinable test signals and incorporating the test signal information therein prior to storage of the data image pages in the memory system's storage medium. Upon retrieval of the data image pages from the storage medium, the test signals are detected and used to form the basis for estimating data member behavior across individual data image pages. Alternatively, the detected test signals form the basis for estimating data member behavior from one data image page to another. Based on the estimated behavior of the data members, appropriate normalization of the data image pages is performed. Advantageously, embodiments of the invention provide enhanced compensation for reproduction inconsistencies existing throughout the data image pages, e.g., inconsistencies inherently caused by holographic storage systems. Interpolation techniques are useful in assisting the behavior estimation and/or the normalization of the data image pages. Alternatively, the behavior estimation is supplemented with generation profiles indicating the behavior of data within the data image pages. The generated profile is used, e.g., to assist in normalizing the data image pages.

DETAILED DESCRIPTION

The invention is described herein primarily in terms of a particular embodiment, namely, behavior estimation and normalization of data images stored in holographic memory systems. However, it should be understood that embodiments of the invention are suitable for use in other page-wise memory systems, i.e., memory systems in which data typically is stored and reproduced as a plurality of multi-dimensional image pages.

In general, the method according to embodiments of the invention involves allocating a portion of data image pages to be stored in a page-wise memory system storage medium and incorporating one or more determinable test signals therein prior to their storage. Upon retrieval of the data image pages from the storage medium, the test signal(s) are detected and their values used to estimate or model (e.g., via a behavioral profile) the behavior of the remaining detected data within the data image pages. The data image pages are normalized accordingly based on these estimations and depending on the manner in which the data is to be eventually used.

For purposes of discussion herein, the term "behavior" refers to the degree of accuracy and to the manner of reproduction of data images stored in, e.g., holographic storage devices. Typically, the behavior is modeled using parametric or non-parametric statistical models. As discussed hereinabove, the behavior sometimes is inconsistent due to effects often inherent in the memory system. Such effects include time-dependent fluctuations in light intensity throughout the storage medium, physical and optical disturbances of the mechanical relationship between system components, thermal expansion and other temperature-induced variations throughout the system, and other noise introduced into the system. Also, it is possible for the behavior of the reproduced data to be influenced by the amount of data storage in the storage device, as the number of data members imprinted in the storage medium generally is inversely proportional to the reliability of the data stored therein.

For purposes of discussion herein, the term "page-wise" is understood as pertaining to or having to do with the storage and retrieval of data in pages in the form of multi-dimensional arrayed patterns of data representations. For example, page-wise memory systems such as holographic memory systems typically store or read out at least one page of data information in a single operation. Such is compared with conventional memory devices, which store data in strings or bits and typically access such data sequentially. In holographic memory systems, for example, it is possible to think of data images typically being stored as a plurality of data image pages in which individual data pages comprise a two-dimensional array of individual data members.

Figure 1:
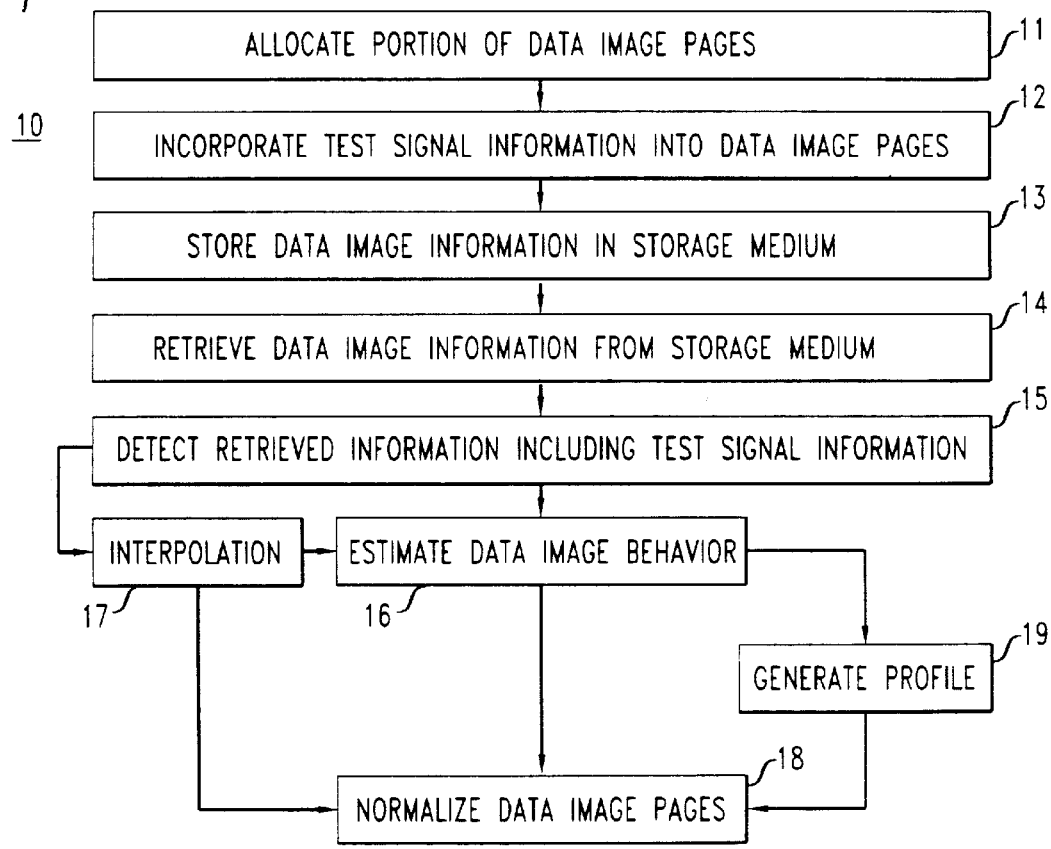
FIG. 1 is a schematic diagram of a data page behavior estimation and normalization method according to an embodiment of the invention.
Figure 2:
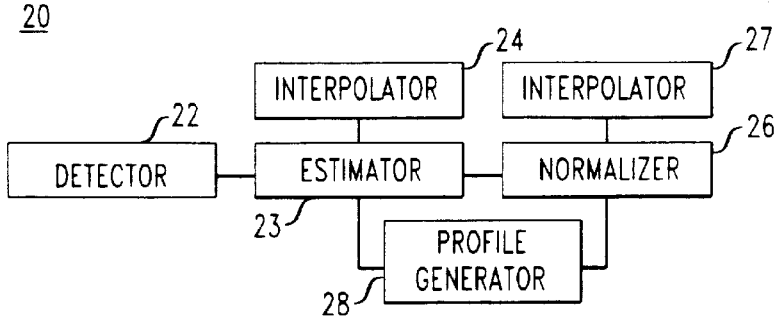
FIG. 2 is a schematic diagram of an apparatus for estimating and normalizing data page behavior according to an embodiment of the invention.

Referring now to FIG. 1, a data normalization method 10 according to an embodiment of the invention is illustrated schematically. FIG. 2 schematically depicts an apparatus 20 for performing data normalization such as normalization method 10 shown in FIG. 1.

As shown in FIG. 1, the first step 11 of the inventive method is to allocate a portion of the data image pages for incorporation of one or more test signals and the second step 12 is to incorporate or encode the allocated portions with one or more test signals. For example, when encoding the data image pages with individual data members, a spatial light modulator (SLM) or other data encoding device is configured to include one or more test signal data members among the data members to be stored within the data image pages. According to embodiments of the invention, the test signal data members have determinable values and are encoded within known or determinable locations within the data image page(s).

Although the test signal data members typically are encoded in approximately the same respective locations within each data image page, it is within the scope of the invention to encode test signal data members at different locations on different pages. According to embodiments of the invention, it is only necessary for the test signal data members to establish some sort of redundancy throughout at least a portion of a data image page and/or across at least two data image pages. That is, the test signal data members need to be spaced across a data image page or positioned in similar locations of multiple data image pages so that the various test signal data members represent different areas of the respective data image page.

For example, in binary applications where the data members represent either a logical "1" or a logical "0", a portion of the data members written to the storage medium are encoded as a fixed pattern of test signal data members, i.e., a fixed pattern of 1s and 0s. Typically, for holographic memory systems, the test signal data members represent approximately $\frac{1}{20}$th or 5% of the total number of data members on a given data image page. However, as will become apparent from discussions hereinbelow, the number of test signal data members per data image page varies depending on the anticipated or initially determined degree of inconsistency of the storage medium. Thus, it is possible for the number of test signal data members per total number of data members on a given data image page to be less than or greater than approximately 5%.

Typically, the fraction of the data image page reserved for test signal data members is based on two effects that should be balanced optimally. First, reserving a larger fraction for test signal data members typically yields a better estimate of the data behavior, which often results in greater error correcting capacity and hence a larger user data capacity of the storage system. However, a smaller fraction for test signal data leaves more of the data image page available for (encoded) user data, thereby also increasing user data capacity. The optimal balance between these two effects typically depends on the inherent smoothness of the behavior and the relative magnitude of the noise in the system. It is believed that the overall performance of the system depends on the ability to estimate behavior and the inherent signal-to-noise ratio. Increasing the accuracy of the behavior estimate by allocating more of the data page for test signal data members degrades the system when the improvement in accuracy is small compared to the inherent noise magnitude and hence little increase in storage capacity results from the improved estimate.

It should be understood that data encoded in a conventional manner comprises both channel data and user data. User data is the actual data input to the storage system that subsequently is encoded for storage and retrieved from the system subsequent to reading the storage medium and decoding the detected channel data. Channel data comprises user data along with non-user data such as encoding, error correction and/or control information data and is the data actually stored in the storage medium. Thus, the test signal data represents a portion of non-user data within the channel data.

Once the one or more test signals have been incorporated into the allocated portions of the data image pages, the encoded data image pages of interest are stored (shown as step 13) within the data storage medium, e.g., in a conventional manner. For example, in holographic memory systems, an encoded signal beam representing a first data image page is intersected with a reference beam to create an interference pattern that is captured or imprinted within the holographic storage medium. Then, the next data image page is encoded as discussed above and stored in a different "location" within the holographic storage medium in a conventional manner via spatial, angular or wavelength multiplexing.

To recover data image pages stored in the storage medium of interest, a retrieval step 14 is performed, e.g., in a conventional manner. Retrieval step 14 reconstructs or reproduces the data members (including the test signal data members) of the data image pages. A detection step 15 determines respective values of the data members within the retrieved data image pages using a detector, such as detector 22 shown in FIG. 2 or other detector capable of detecting page-wise information. Depending on the type of detector used, it is possible to perform both retrieval step 14 and detection step 15 using the same detecting device.

For example, in holographic memory systems, data retrieved or reproduced from the holographic data storage media is detected by the light-sensitive pixel elements of a sensor, such as a charged coupled device (CCD), a CMOS detector array such as an active pixel sensor (APS) or other appropriate device capable of reading out or detecting the stored data. The array of pixel elements within such a sensor typically is sensitive to the various data member light intensities emanating from the holographic storage medium and generates electrical or other signals corresponding to the various light intensities detected thereby. The generated signals exist as analog signals or, alternatively, are converted to their corresponding digital values before further processing is performed.

Detectors such as APS detectors used in holographic memory systems typically are fabricated circuit devices adapted for coupling to other circuit devices. Alternatively, the detectors and one or more circuit devices are fabricated together, e.g., on the same CMOS integrated circuit (IC) chip. For example, see generally co-pending application "Apparatus And Method For Processing Data Stored In Page-Wise Memory", Ser. No.: , Atty. Docket: , filed on even date herewith.

Detection step 15 determines the values of the individual data members or pixels within the retrieved data image pages. Such detection includes the detection of the values of the channel data members including the values of the test signal data members.

As discussed previously herein, the behavior or degree of accuracy of reproduced data image pages retrieved from, e.g., holographic storage media, typically is inconsistent and oftentimes uncertain because of inherent inconsistencies that may have been present in the storage media from which the data was retrieved. Such behavior varies within data image pages and from one data image page to another. However, the inventive method and apparatus advantageously recognize that the behavior of individual data members typically varies gradually or smoothly across a given data image page or from one data image page to another but does not vary much, from a relative standpoint, within a limited area of a given data image page.

Thus, the estimation, modeling and/or determination of the value of one or more detected test signal data members (or, e.g., their collective average value) within an area gives a general indication of the behavior within that particular area of the data image page, including the behavior of the data members therein. As discussed hereinabove, test signal data members are encoded as a pattern of determinable data values. Thus, knowing the intended values of the test signals and comparing those initially encoded values to the retrieved test signal values allows data behavior within the local area of the test signals of interest to be estimate, modeled and/or determined.

Furthermore, the collective local behaviors of the test signals disposed throughout one or more data image pages provides the basis for estimating the data behavior across an entire data image page. Similarly, this information also provides the basis for estimating the data behavior between data image pages, i.e., from one data image page to another. In this manner, an estimating step 16 is performed, e.g., by an estimator 23.

According to an embodiment of the invention, an interpolation step 17 is performed, e.g., by an interpolator 24, to assist estimator 23 in performing estimating step 16. In this manner, estimating step 16 uses the estimated or detected local behavior of the test signal(s) and one or more interpolation techniques to estimate the behavior of the data members in other areas of interest. Typically, the behavior over an entire area of interest is estimated, including those non-local areas between the estimated local areas. That is, the estimated local behavior of test signals are used to determine estimated behaviors for data members between local behavior test areas.

Similarly, interpolation techniques are usable to assist in estimating data member behavior from one data image page to another. For example, the behavior of a certain data member "location" within a data image page is generally determinable by interpolating the behavior of similar data member "locations" of nearby data image pages.

That is, for a plurality of data image pages $p_i-p_x$, each having a corresponding plurality of data members $d_1-d_y$, it is possible to use interpolation techniques to determine the unknown behavior of, e.g., data member $d_6$ of page $p_5$, using the known values of data member $d_6$ of, e.g., pages $p_1$, $p_2$, $p_4$, $p_7$, $p_8$ and $p_{10}$.

Based on the results of estimating step 16, a normalizing step 18 normalizes the known and estimated data member values, e.g., using a normalizer 26. For example, normalizer 26 uses conventional techniques, including the use of the interpolation techniques of another interpolator (shown as 27), to adjust the data member values accordingly. The extent of normalization varies depending on the eventual use or application of the data member values.

Alternatively, estimating step 16 generates a data member profile (shown as generating step 19) to assist normalizing step 18 in normalizing the data member values. Generating step is performed, e.g., by a profile generator 28. Such data member profile generation is discussed further hereinbelow.

As discussed above, in holographic memory systems and other page-wise systems, detector 22 typically is one or more fabricated circuit devices adapted for coupling to other circuit devices. Similarly, estimator 23, normalizer 26, profile generator 28 and interpolators 24, 27 typically are fabricated circuit devices adapted for coupling to other circuit devices or, alternatively, are formed together with other circuit devices, e.g., on the same CMOS IC chip.

As discussed previously, embodiments of the invention are based on the realization that the behavior of individual data members varies gradually or smoothly over a given data image page or from one data image page to another but is similar within a limited or local data area. Therefore, for data image pages having, e.g., an m×n array of data members, it is possible to represent data member behavior, e.g., as the sum of a "smooth" function, $f(b(x, y), x, y)$, where x and y index the particular data member of interest within the array and $b(x, y)$ denotes the channel data member assigned to location x, y, and $n(b(x, y), x, y)$, which represents noise, whose statistics also vary smoothly over the data image pages.

Figure 3:
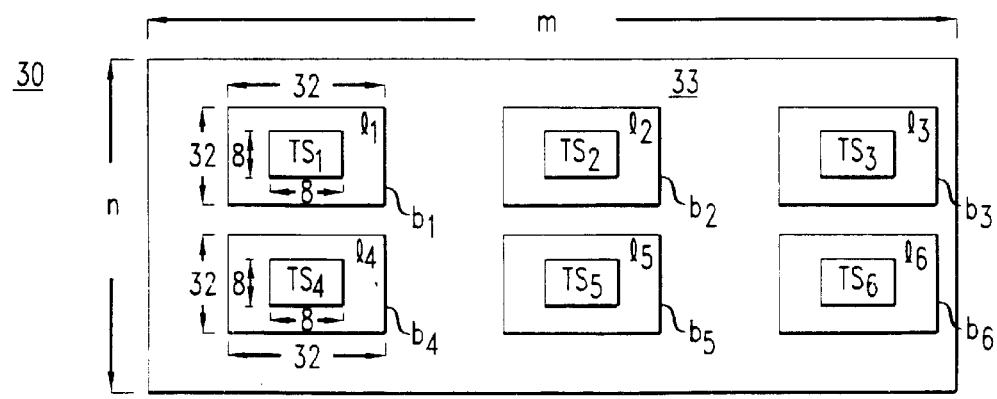
FIG. 3 is a schematic diagram of representative a data image page illustrating the allocation of test signals therein according to an embodiment of the invention.

As shown in FIG. 3, a data image page 30 is shown as an m x n array of data members having at least a portion thereof decomposed or grouped into local blocks, e.g., $b_1, b_2, \ldots b_6$, having, e.g., 32×32 data members per block. Data image page 30 also has non-local areas (shown as 33) between local blocks $b_1, b_2, \ldots b_6$. It should be understood that the data members are grouped as blocks for purposes of discussion herein and that such blocks do not exist within the actual data image pages of, e.g., holographic storage systems.

According to an embodiment of the invention, a portion of one or more blocks $b_1$–$b_6$ is reserved for test signal members. For example, as shown, 8×8 test signal blocks (shown as $ts_1$–$ts_6$) are reserved within blocks $b_1$–$b_6$. Within test signal blocks $ts_1$–$ts_6$ are, e.g., a determinable pattern of 1s and 0s. Typically, the pattern is an equal or approximately equal number of 1s and 0s distributed similarly throughout the 8×8 test signal blocks.

Using the determinable pattern of 1s and 0s within the test signal blocks, representative test signal values for 1 and 0 are estimated for particular 8×8 test signal blocks. For example, the representative test signal values within a given test signal block are determined, e.g., by averaging or taking a modified average of the respective 1s and 0s contained therein. Also, it is possible to estimate other statistical parameters of detected values of 1s and/or 0s, such as variance.

Although the example shown uses 8×8 test signal blocks, it should be remembered that embodiments of the invention are capable of using 1×1 test signal blocks. In such case, either no 0s or no 1s are present within the block. Therefore, no estimated representative value is made for the missing data type.

Based on the representative test signal values as detected throughout data image page 30, the behavior of local data members within the 32×32 blocks are estimated, e.g., using interpolation or other conventional estimation techniques. That is, within a given 32×32 block, the behavior of the local data members therein are estimated using the block's determined test signal values. The estimation techniques take into consideration the invention's realization that the behavior of local data members are relatively similar, at least within the local area. In this manner, the behavior of the local data members within $b_1$ (shown as $l_1$) is estimated based on the representative test signals of block $b_1$.

However, the estimation of the behavior of local data members is affected slightly by the estimated values of test signal members and local data members from other blocks within data image page 30. For example, the estimation of the behavior of local data members within block $b_1$ are influenced slightly by the behavior of local data members within, e.g., blocks $b_3$ and $b_4$ and even less slightly by the estimated behavior of data members within, e.g., blocks $b_5$ and $b_6$. Therefore, in estimating local behavior, estimation models should consider the influences of non-local areas and take them into account accordingly.

In general, estimations typically are made for the behavior of the data members across the entire data image page 30, including the data members within the non-local areas 33. Such estimation typically involves, e.g., using estimated test signal values as vertices for techniques such as linear interpolation therebetween. Also, such estimation takes into account the advantageous realization that behavior of individual data members across a data image page, e.g., from block $b_1$ to block $b_6$, tends to vary gradually or smoothly and thus is well approximated by interpolative smoothing functions. Thus, the behavior of non-local data members 33 between blocks $b_1$–$b_6$ is estimated as gradual or smooth variations between regions of known behavior (e.g., test signal blocks $ts_1$–$ts_6$) and of estimated regions having similar behavior (e.g., local areas $l_1$–$l_6$).

As shown in FIGS. 1 and 2, after estimations of both local and non-local data members are determined, it is useful to normalize the estimated data member values to effectively decrease or even eliminate the effects of reproduction inconsistencies. The extent of the normalization of the data depends, e.g., the perceived degree of inconsistency present in the data. Also, the eventual application of the data and its attendant degree of accuracy dictates data normalization. For example, in digital processing applications, the data members typically represent one state of a logical low state (e.g., "0") or a logical high state (e.g., "1"). In such applications, the detected data member values are normalized, e.g., so that the data members intended to be in the logical low data states have a value of approximately 0.0 on average and the detected data members intended to be logical high data states have a value of approximately 1.0 on average. However, the numerical values 0.0 and 1.0 are arbitrary.

As an example, consider a binary input arrayed within a data image page at location x, y represented as b(x, y) and the detected output at location x, y represented as d(x, y). This representation assumes a 1 to 1 correspondence between the input data array and the detector array. However, such assumption is not necessary, as it is possible, e.g., for the detector array to oversample the input data.

Using the example representations given above, the detected output is represented as $$d(x, y) = f(b(x, y), x, y) + n(b(x, y), x, y),$$

where f(1, x, y) and f(1, x, y) are smooth functions; and n(1, x, y) and n(0, x, y) are zero mean noise processes whose statistics vary smoothly in x and y. Within the 8×8 blocks, e.g., $ts_1$–$ts_6$, estimates off are represented, e.g., as $$f'(1, ts_i) = \frac{1}{32} \sum_{(x,y) \in ts_i; b(x,y)=1} d(x, y)$$

$$f'(0, ts_i) = \frac{1}{32} \sum_{(x,y) \in ts_i; b(x,y)=0} d(x, y)$$

based on the assumption that each block $ts_i$ contains 32 "1" and 32 "0" test signal data members. Also, local estimates of the variance n(1, x, y) and n(0, x, y) are respectively represented, e.g., as $$v'(1, ts_i) = \frac{1}{31} \sum_{(x,y) \in ts_i; b(x,y)=1} (d(x, y) - f'(1, ts_i))^2$$

$$v'(0, ts_i) = \frac{1}{31} \sum_{(x,y) \in ts_i; b(x,y)=0} (d(x, y) - f'(0, ts_i))^2$$

For locations x, y in the detector array, estimates f'(1, x, y) and f'(0, x, y) of f(1, x, y) and f(0, x, y) are respectively defined, e.g., as $$f'(1, x, y) = \sum_i w(1, i, x, y) f'(1, ts_i)$$

-continued $$f'(0, x, y) = \sum_i w(0, i, x, y) f'(0, ts_i)$$

where typically $w(b, i, x, y) \leq 0$ and for x, y, and b, $$\sum_i w(b, i, x, y) = 1.$$

Such estimations are of the form of general linear interpolation models. Typically, the w(b, i, x, y) is larger for those i, x, y where the block $ts_i$ is nearer the location x, y. Similarly, estimates for the variance of n(b, i, x, y), b=0, 1 for x, y are obtainable. In this sense, the estimates are formed from the local detected test signal values.

Also, normalization of data d(x, y) is possible, e.g., by defining $$d'(x, y) = \frac{d(x, y) - f'(0, x, y)}{f'(1, x, y) - f'(0, x, y)}.$$

Such normalization is advantageous, e.g., when the output data is to be presented to an error correcting algorithm or similar application. Error correction algorithms often are designed on the assumption that the data is independent and identically distributed (i.i.d.).

In embodiments of the invention using holographic data, the magnitude of n(b, x, y) tends to vary approximately proportionally with the diffracted energy, which is approximately proportional to f'(1, x, y) -f'(0, x, y). Thus, normalized data d'(x, y), where b(x, y)=b for b =0, 1 are distributed similarly. Also, it has been observed that n(b, x, y) and n(b, x', y') typically are nearly statistically independent when (x, y) (x', y'). It is possible to make an estimate of the variance of {d'(x, y) : b(x, y)=1} and {d'(x, y) : b(x, y)=0} by combining or interpolating and normalizing the estimates v'(1, $ts_i$) and v'(0, $ts_i$), for example.

Alternatively, the various estimates are used to estimate the likelihood that b(x, y) is a 1 or 0 given the observed d(x, y). The likelihood ratio is a dimensionless quantity useful, e.g., as an input to various error correcting schemes.

As mentioned previously herein, the locally estimated test data member behaviors provide the information necessary to generate an overall profile of the behavior across the data image pages 30. Such profile is generated in a conventional manner, e.g., by a profile generator 28 (shown in FIG. 2). Again, according to embodiments of the invention, the generated behavior profile indicates the gradual or smoothing behavioral transition across the data image page 30 of interest.

Although embodiments of the invention shown and described herein depict a binary data state arrangement (i.e., two possible data states), embodiments of the invention also are readily applicable in data storage arrangements where more than two data states are employed.

Also, although embodiments of the invention have been discussed in terms of performance within the analog domain, it clearly is within the scope of embodiments of the invention to include analog-to-digital conversion as desired. That is, it is possible to have analog-to-digital conversion of the information at any stage in method 10. However, for purposes of soft decoding and other related applications, analog-to-digital conversion is not performed, e.g., until after normalizing step 18, i.e., after the information has been output from normalizer 26 in the embodiment shown in FIG. 2. Alternatively, in the embodiment shown in FIG. 1, it is possible for analog-to-digital conversion to occur, e.g., between retrieval step 14 and detecting step 15 or after detecting step 15.

Also, it should be noted that although test signal data members are depicted herein in a manner that suggests allocation and storage only in adjacent locations within data image pages, it should be noted that such requirement is unnecessary. For example, pixel elements and other detectors are capable of being fabricated and/or operated in any desired arrangement within the data sensor device(s). Thus, for example, the test signal data members are randomly addressable and detectable within data image pages and from data image page to data image page. Random addressability is discussed in greater detail, e.g., in co-pending applications "Apparatus And Method For Processing Data Stored In Page-Wise Memory", U.S. Pat. No. 5,838,669, and, "Comparator-Based Thresholding Method For Determining Data Values", Ser. No.: 08/777,154, filed on even date herewith.

It will be apparent to those skilled in the art that many changes and substitutions can be made to the embodiments of the data value determination methods and apparatus herein described without departing from the spirit and scope of the invention as defined by the appended claims and their full scope of equivalents.

What is claimed is:

1. A method for modulating data retrieved from a page-wise data storage medium including a data image page with at least one test signal included within a portion thereof, said method comprising the steps of:

detecting at least a portion of the retrieved data from the data image page including said at least one test signal; and estimating the behavior of at least a portion of the retrieved data based on the detection of said at least one test signal within the data image page.

2. The method as recited in claim 1, further comprising the step of normalizing at least a portion of the retrieved data based on the estimated behavior thereof.

3. The method as recited in claim 1, wherein said normalizing step includes interpolating the behavior of the retrieved data based on the estimated behavior of the individual data image page.

4. The method as recited in claim 1, wherein said estimating step includes interpolating the behavior of the retrieved data based on the detected test signals.

5. The method as recited in claim 1, further comprising the step of generating a profile of at least a portion of the retrieved data based on the estimated behavior thereof, said profile modeling the estimated behavior of the retrieved data.

6. The method as recited in claim 1, further comprising the step of generating a profile of at least a portion of the retrieved data, and wherein said normalizing step is based on the generated profile.

7. The method as recited in claim 1, wherein said at least one test signal further comprises a plurality of test signals having determinable data states, and wherein said detecting step further comprises determining the values of said data members.

8. An apparatus for modulating data retrieved from a page-wise data storage medium, said retrieved data including a data image page having one or more test signals included within a portion thereof, said apparatus comprising:

a detector for detecting at least a portion of the retrieved data including said test signals; and an estimator operably coupled to said detector for estimating the behavior of at least a portion of the data within said data image page, said estimator estimating the data behavior based on the detected test signals.

9. The apparatus as recited in claim 8, further comprising a normalizer operably coupled to said estimator for normalizing the retrieved data based on the estimated data behavior.

10. The apparatus as recited in claim 9, wherein said normalizer includes an interpolator for interpolating at least a portion of the normalized data, said interpolator interpolating at least a portion of the normalized data based on the estimated behavior of at least a portion of the retrieved data.

11. The apparatus as recited in claim 8, further comprising a profile generator for generating a profile of at least a portion of the retrieved data based on the estimated behavior thereof.

12. The apparatus as recited in claim 8, wherein said estimator includes an interpolator for estimating the behavior of the retrieved data, said interpolator interpolating the behavior of the retrieved data based on the detected test signals.

13. A method for encoding data for storage in a page-wise storage medium, said data including at least one data image page, said method comprising the steps of:

allocating at least a portion of said data image page for incorporation of at least one test signal therein; and incorporating at least one test signal having at least one determinable parameter into the allocated portion of said data image page, said incorporated test signals used in estimating the behavior of at least a portion of the stored data retrieved from said page-wise storage medium.

14. The method as recited in claim 13, wherein said data image page is stored in a page-wise storage medium and wherein said method further comprises the step of detecting at least a portion of the incorporated data having test signals stored in said page-wise storage medium for determining the behavior of at least a portion of the stored data retrieved from said page-wise storage medium.

15. The method as recited in claim 13, wherein said test signal is incorporated in such a way that at least a first portion of said test signal is incorporated within at least a first portion of said data image page and at least a second portion of said test signal is incorporated within at least a second portion of said data image page different from said first portion.

16. The method as recited in claim 13, wherein said data image page is stored in a page-wise storage medium and wherein said method further comprises the steps of:

detecting at least a portion of the stored data including the test signal parameters; and estimating the behavior of at least a portion of the stored data retrieved from said page-wise storage medium based on the detected test signals.

17. The method as recited in claim 16, further comprising the step of generating a profile of at least a portion of the retrieved data based on the estimated data behavior.

18. The method as recited in claim 16 or 17, wherein said test signals further comprise a plurality of data members having determinable data states, wherein said detecting step further comprises determining the values of at least a portion of said data members, and wherein said estimating step estimates the retrieved data based on the determined data member values.

19. The method as recited in claim 13, wherein said data image page is stored in a page-wise storage medium and wherein said method further comprises the steps of:

detecting at least a portion of said test signals;

estimating the behavior of at least a portion of the stored data retrieved from said page-wise storage medium based on the detected test signals; and normalizing at least a portion of the data retrieved from said page-wise storage medium based on the estimated data behavior.

20. The method as recited in claim 13, wherein said test signals further comprise a plurality of data members, and wherein said incorporating step further comprises incorporating said data members into the allocated portion of said data images.

\* \* \* \* \*